United States Patent
Tayrani et al.

(10) Patent No.: US 7,345,539 B2
(45) Date of Patent: Mar. 18, 2008

(54) BROADBAND MICROWAVE AMPLIFIER

(75) Inventors: Reza Tayrani, Marina Del Rey, CA (US); Jonathan D. Gordon, Hermosa Beach, CA (US)

(73) Assignee: Raytheon Company, Waltham, MA (US)

( * ) Notice: Subject to any disclaimer, the term of this patent is extended or adjusted under 35 U.S.C. 154(b) by 155 days.

(21) Appl. No.: 11/054,968

(22) Filed: Feb. 10, 2005

(65) Prior Publication Data
US 2006/0176114 A1    Aug. 10, 2006

(51) Int. Cl.
   *H03F 1/04* (2006.01)
(52) U.S. Cl. .................. 330/207 A; 330/302; 330/251
(58) Field of Classification Search ............ 330/207 A, 330/251, 302
   See application file for complete search history.

(56) References Cited

U.S. PATENT DOCUMENTS

| | | | |
|---|---|---|---|
| 3,919,656 | A | 11/1975 | Sokal et al. |
| 4,178,556 | A * | 12/1979 | Attwood ....................... 330/10 |
| 4,763,087 | A | 8/1988 | Schrader et al. |
| 5,146,178 | A | 9/1992 | Nojima et al. |
| 6,121,840 | A * | 9/2000 | Sakusabe .................... 330/277 |
| 6,211,749 | B1 | 4/2001 | Yuzurihara et al. |
| 6,232,841 | B1 | 5/2001 | Bartlett |
| 6,552,610 | B1 * | 4/2003 | Grebennikov et al. ...... 330/251 |
| 6,618,276 | B2 * | 9/2003 | Bennett .................... 363/56.02 |
| 6,784,732 | B2 * | 8/2004 | Hajimiri et al. ............. 330/251 |
| 6,937,096 | B2 * | 8/2005 | Wight et al. ................. 330/251 |
| 6,949,978 | B2 * | 9/2005 | Tayrani et al. .............. 330/251 |
| 2004/0008082 | A1 * | 1/2004 | Dow ........................... 330/51 |
| 2004/0027209 | A1 | 2/2004 | Chen |
| 2004/0113689 | A1 | 6/2004 | Hajimiri |

OTHER PUBLICATIONS

Sokol, N.O., et al, "Class-E—A new class of high efficiency tuned single-ended switching power amplifier," IEEE JSSC, vol. SSC-10, pp. 168-176, Jun. 1975.

(Continued)

*Primary Examiner*—Patricia Nguyen
(74) *Attorney, Agent, or Firm*—Leonard A. Alkov

(57) ABSTRACT

A Class-E load circuit topology suitable for switching mode Power Amplifiers (PAs). The inventive load includes a shunt inductive element coupled to an output of said amplifier; a series inductive element coupled to said output of said amplifier; and a series capacitive element coupled to said series inductive element. In the illustrative embodiment, the inventive load is operable at frequencies in the range of 8-10 GHz and the shunt inductive element is an inductive bias line for said amplifier. The invention enables an advantageous Class-E amplifier design comprising an input matching network; an active device coupled to the input matching network and a load coupled to the active device and implemented in accordance with the present teachings. Also disclosed is a method for designing a load for use with a Class-E amplifier including the steps of: providing a lumped equivalent circuit representation of the load; optimizing the lumped equivalent circuit representation of the load to achieve near ideal current and voltage operational characteristics over a predetermined frequency range using a time domain simulation; transforming the optimized lumped equivalent circuit representation of the load to a distributed circuit representation; and optimizing the distributed circuit representation of the load to achieve near ideal current and voltage operational characteristics over a predetermined frequency range using a time domain simulation.

1 Claim, 6 Drawing Sheets

OTHER PUBLICATIONS

Raab, F.H., et al, "Solid State Radio Engineering," John Wiley & Sons, 1980, pp. 432-470.

Sowlati, T., et al, "Low Voltage, HIgh Efficiency Class E GaAs Power Amplifiers for Mobile Communications," IEEE GaAs IC Symposium Digest 1994, pp. 171-174.

Mader, T., et al, "Switched-Mode High-Efficiency Microwave Power Amplifiers in a Free-Space Power Combiner," IEEE MTT, vol. 10, Oct. 1998, pp. 1391-1398.

Watson, P., et al, "Ultra-High Efficiency Operation Based on an Alternative Class-E Mode," IEEE GaAs IC Symposium Digest 2000, pp. 53-56.

Tayrani, R., "A Monolithic X-band Class-E Power Amplifier," IEEE GaAs IC Symposium, pp. 205-208, Oct. 2001.

Sokal, N.O., "RF power amplifiers-classes A through S", Electro/95 International Profesional Program Proceedings, Boston, MA, USA, Jun. 21-23, 1995, New York, NY, USA, IEEE, US, pp. 335-400.

* cited by examiner

BROADBAND MICROWAVE AMPLIFIER

BACKGROUND OF THE INVENTION

1. Field of the Invention

The present invention relates to electrical and electronic circuits and systems. More specifically, the present invention relates to microwave Class E power amplifiers.

2. Description of the Related Art

For a variety of commercial and military applications, highly efficient microwave and radio frequency (RF) power amplifiers are needed. Typical applications include wireless local area networks, cell phones and telecommunication systems as well as advanced airborne active phased array radar systems. The choice of technology, design methodology and manufacturing cycle time are major cost contributors in these systems. Switching mode, Class-E, high-efficiency power amplifiers are useful for these and other applications inasmuch as these amplifiers limit the power and associated cooling costs thereof. A Class-E amplifier is part of the "switching mode amplifiers" such as class D, E, F, etc. In these types of amplifiers, the transistor operates as a perfect switch with no overlapping voltage & current waveforms at its output terminal, thereby ideally dissipating zero DC power. Other classes of amplifiers such as class A, A/B and C, operate as a current-source with overlapping voltage & current waveforms and hence dissipate DC power leading to a lower efficiency.

Class-E amplifiers use a series or parallel resonant load network. The function of the load network in the class E amplifier is to shape the voltage and current waveforms. The current and voltage time-waveforms at the active device output terminal are optimized in such a way as to minimize the DC power dissipation within. The active device, a pHEMT in this case, acts as a switch, driven by the RF input signal to "ON" and "OFF" conditions. The operating point of the device is such that the device is either OFF (in the pinched-off region) or ON (in the linear region). Under an ideal switching operation condition, output voltage and current waveforms at the device output terminal do not exist simultaneously and, therefore, the energy dissipated within the device is zero, yielding a 100 percent theoretical power conversion efficiency.

In any event, the maximum efficiency of Class-E amplifiers (i.e. the ratio of the RF output power to the DC input power) and its bandwidth of operation are limited by the tuned loads thereof. The limitation is due to the fact that presence of the tuned load results in a very narrow operational bandwidth for the amplifier.

Hence, a need remains in the art for a system or method for increasing the power, power added efficiency (PAE) and bandwidth of Class-E amplifiers.

SUMMARY OF THE INVENTION

The need in the art is addressed by load circuit topologies of the present invention suitable for switching mode Power Amplifiers (PAs). In a most general sense, the inventive load includes a shunt inductive element coupled to an output of said amplifier; a series inductive element coupled to said output of said amplifier; and a series capacitive element coupled to said series inductive element.

In the illustrative embodiment, the inventive load is operable at frequencies in the range of 8-10 GHz and beyond. The shunt inductive element, part of the said load is suitably chosen to provide two important functions. First, to provide an inductive bias line for said amplifier and second, to provide a parallel resonance with the pHEMT's output drain-source capacitance (Cds).

The invention enables an advantageous Class-E amplifier design comprising an input matching network; an active device coupled to the input matching network and a load coupled to the active device and implemented in accordance with the present teachings.

Also disclosed is a method for designing a load for use with a Class-E amplifier including the steps of: providing a lumped equivalent circuit representation of the load; optimizing the lumped equivalent circuit representation of the load to achieve near ideal current and voltage operational characteristics over a predetermined frequency range using a time domain simulation; transforming the optimized lumped equivalent circuit representation of the load to a distributed circuit representation; and optimizing the distributed circuit representation of the load to achieve near ideal current and voltage operational characteristics over a predetermined frequency range using a time domain simulation.

The unique properties of the inventive load circuits enable Class-E HPAs to maintain a simultaneous high PAE and Power over a broad bandwidth.

BRIEF DESCRIPTION OF THE DRAWINGS

FIG. 1b is a distributed component implementation of the load depicted in FIG. 1a.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1A:
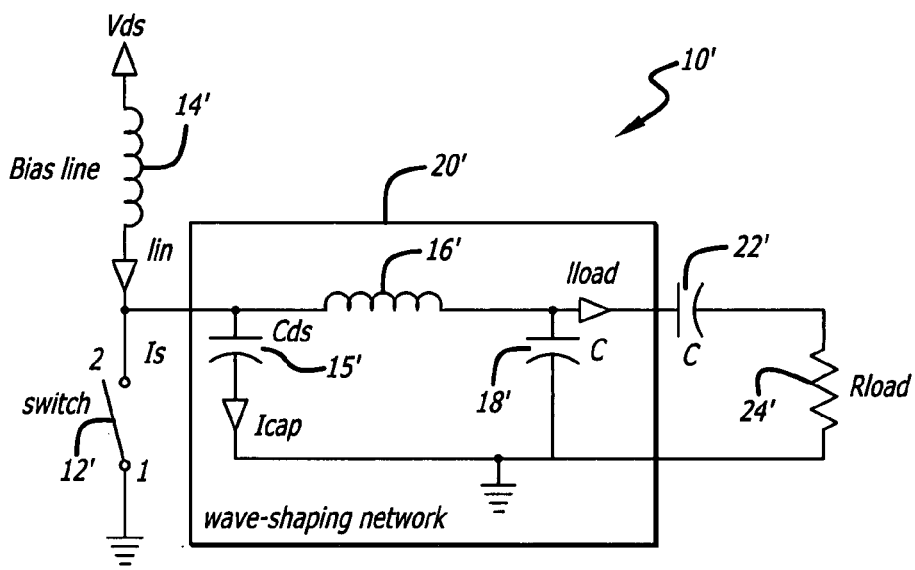
FIG. 1a is a simplified schematic diagram of an ideal discrete component implementation of a typical Class-E load in accordance with conventional teachings.

FIG. 1a is a simplified schematic diagram of an ideal discrete component implementation of a typical Class-E load in accordance with conventional teachings. As shown in FIG. 1a, a typical Class-E amplifier represented by a switch 12' is coupled to a source $V_{ds}$ via an inductive bias line 14'. The switch 12' is coupled to a resistive load 24' via a capacitor 22' and an inverted L type (series L, shunt C) wave shaping load network 20'. The drain bias line 14' is treated independent of the load circuit 20', merely acting as a choke realized by a quarter wavelength length of transmission line.

The load 20' includes a first shunt capacitor 15' which is the drain to source capacitance ($C_{ds}$) of the transistor switch 12'. In accordance with conventional teachings, the load 20' includes a series inductor 16' (L) and a shunt capacitor 18' (C).

Figure 2A:
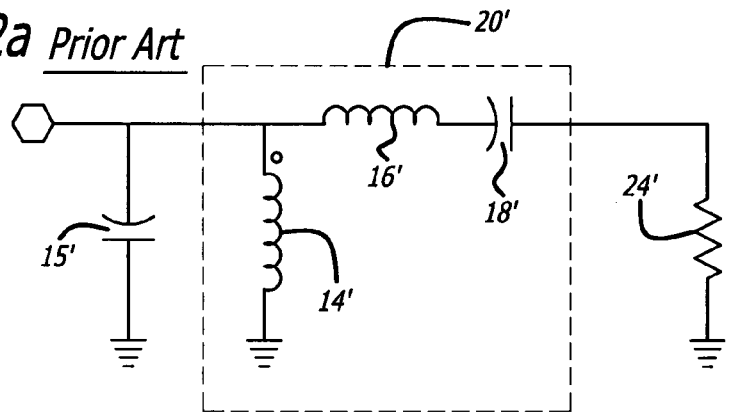
FIG. 2a is a simplified schematic diagram of a typical Class-E load in accordance with the conventional teachings.

FIG. 2a is a simplified schematic diagram of a typical Class-E load in accordance with the conventional teachings.

Figure 1B:
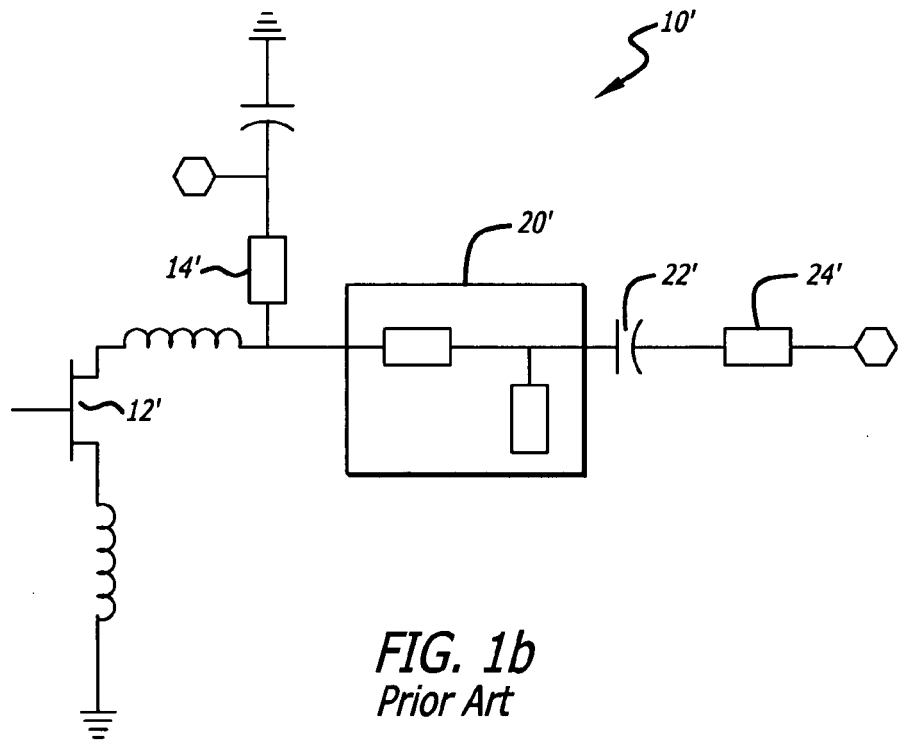

FIG. 1b is a distributed component implementation of the load depicted in FIG. 1a. It is worth mentioning that the function of the load network in the class E amplifier is to shape the voltage and current waveforms. Therefore, for the design of a broadband Class-E amplifier, care should be taken to ensure Class-E waveforms exist over the entire frequency band. Choices of a suitable device non-linear modeling tool as well as a design environment tool capable of time domain, robust harmonic balance and envelope simulation are critical for the successful design of highly non-linear circuits such as the switching mode amplifiers.

Figure 2B:
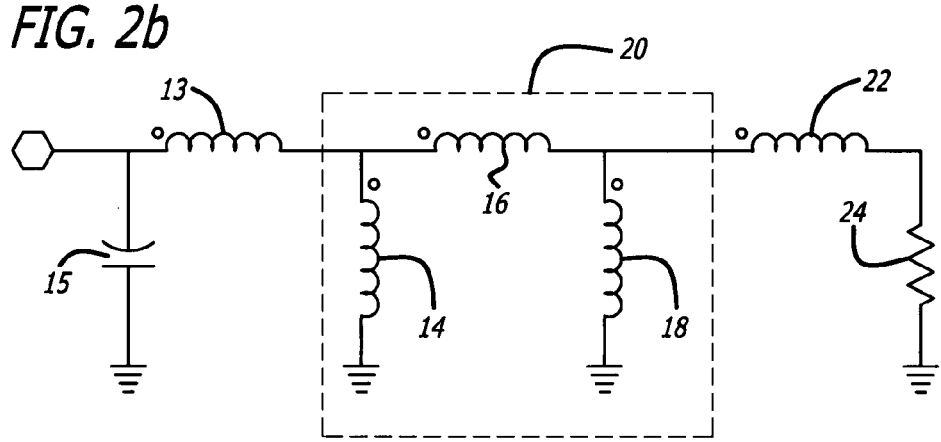
FIG. 2b is a simplified schematic diagram of an ideal discrete component implementation of a typical Class-E load in accordance with the teachings of the present invention.

FIG. 2b is a simplified schematic diagram of an ideal discrete component implementation of a typical Class-E load in accordance with the teachings of the present invention.

Figure 2C:
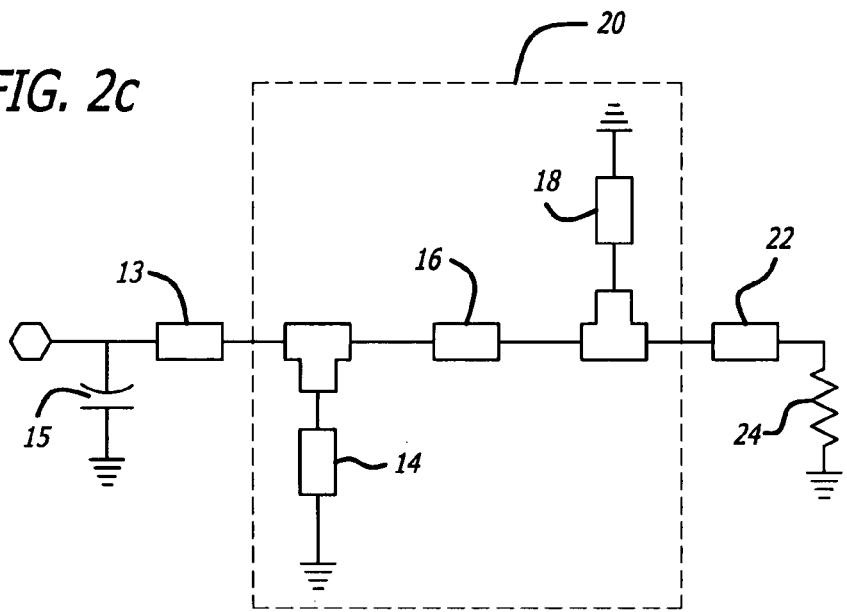
FIG. 2c is a distributed component implementation of the load depicted in FIG. 2b.

FIG. 2c is a distributed component implementation of the load depicted in FIG. 2b. In accordance with the present teachings, a novel broadband Class-E load topology is presented based on the series (L-C) network shown in FIG. 2b. As discussed more fully below, the load is modified to offer a superior broadband performance when compared with the (series L, shunt C) load network of FIGS. 1a and 1b. In accordance with the present teachings, the first step in the novel design process is to include the drain bias inductor 14' as part of the Class-E load topology followed by the transformation of the lumped network representation (FIG. 2b) to its equivalent distributed network form (FIG. 2c). In this critical transformation process which is necessary for the amplifier to operate at microwave frequencies, the series inductor 16' and series capacitor 18' of FIG. 2a are replaced by a combination of a series transmission line 16 and a shunt shorted stub 18 as shown in FIG. 2c. Also, the shunt inductor 14' of FIG. 2a is replaced with a shunt shorted stub 14 (FIG. 2c) to provide a parallel resonance with the pHEMT's output drain-source capacitance (Cds) as well as to provide a bias to the drain of the pHEMT transistor.

Next, starting values for the lumped components of the load network 20 (FIG. 2b) are ascertained. Several authors have published detailed expressions for the starting values of the lumped series (L, C) Class-E load. See for example "Class-E-A new class of high efficiency tuned single-ended switching power amplifier", by N. O. Sokal, et al. IEEE JSSC, vol. SSC-10, pp. 168-176, June 1975; "Solid State Radio Engineering" by F. H. Raab, et al., John Wiley & Sons, 1980; "Low Voltage, High Efficiency Class E GaAs Power Amplifiers for Mobile Communications", by T. Sowlati, et al. IEEE GaAs IC Symposium Digest 1994, pp. 171-174; "Switched-Mode High-Efficiency Microwave Power Amplifiers In A Free-Space Power Combiner", by T. Mader, et al., IEEE MTT, vol. 10. October 1998, pp. 1391-1398; and "Ultra-High Efficiency Operation Based On An Alternative Class-E Mode", P. Watson, et al., IEEE GaAs IC Symposium Digest 2000, pp. 53-56.

Next, having obtained the starting values for the load network, a time domain simulation is performed to optimize the load with the objective of obtaining near ideal current and voltage waveforms over a desired operating range (e.g. 8-10 GHz).

Figure 2D:
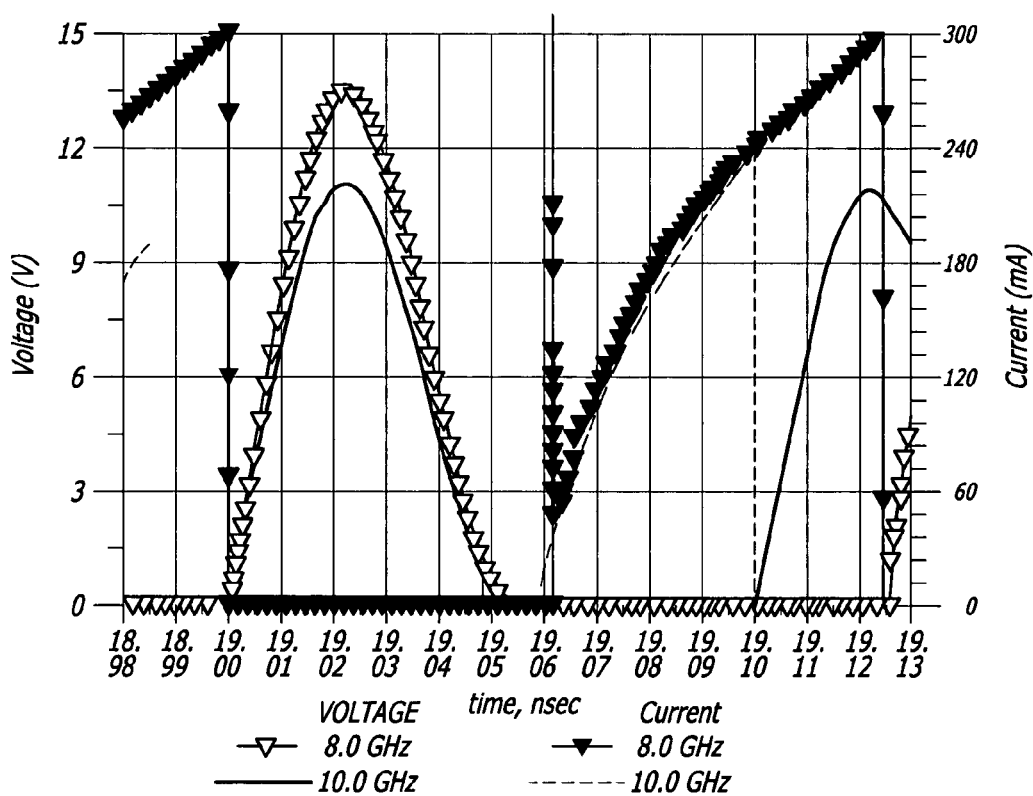
FIG. 2d shows graphs of current and voltage waveforms of a lumped equivalent circuit representation of the load designed in accordance with the present teachings.
Figure 3A:
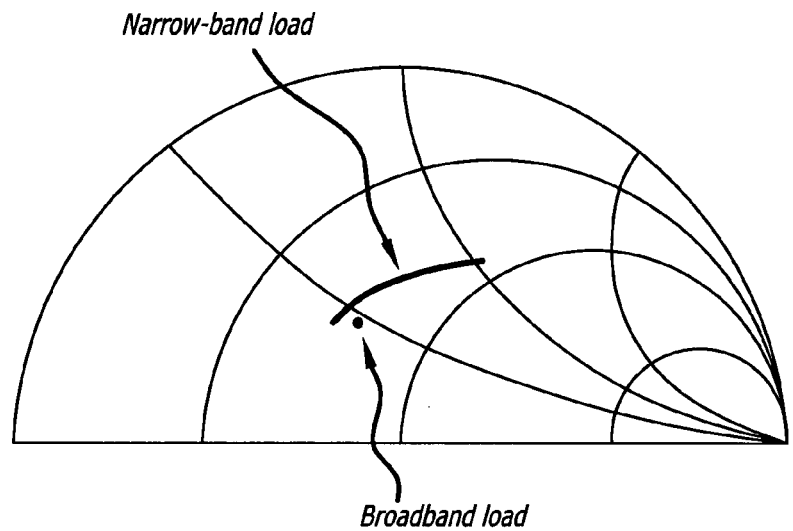
FIG. 3a is a Smith chart showing frequency dependency of a broadband lumped load designed in accordance with the teachings of the present invention.

FIG. 2d shows these simulated waveforms illustrating near ideal performance over 2.0 GHz of bandwidth. The frequency dependency of the broadband lumped equivalent circuit representation of the load is shown in FIG. 3(a), depicting an excellent frequency independent response over 8.0-10.0 GHz compared to the narrowband Class-E load (series L, shunt C). See "A Monolithic X-band Class-E Power Amplifier", by R. Tayrani, IEEE GaAs IC Symposium, PP 205-208, October 2001.

Having obtained a nearly frequency independent magnitude and phase response for the lumped equivalent circuit representation of the load network (FIG. 2b), we can now proceed to the next step by transforming this load to its equivalent distributed network. (See FIG. 2c.)

To optimize the distributed load, the time domain optimization process described for the lumped load is repeated for the distributed load.

Figure 3B:
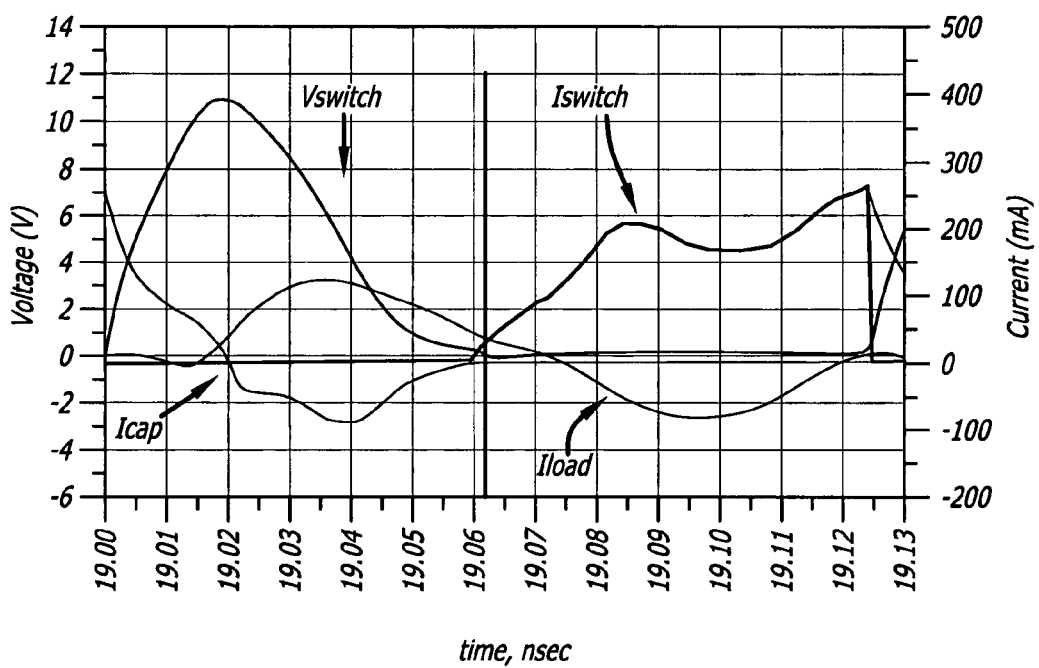
FIG. 3b is a diagram which depicts the time domain simulation of the distributed load network illustrating near ideal performance at 8 GHz in accordance with the teachings of the present invention.

FIG. 3b is a diagram which illustrates the time domain simulation of the distributed load network illustrating near ideal performance at 8 GHz. As shown in FIG. 3b, the voltage waveform across the switch rises slowly at switch-off and falls to zero at the end of the half-cycle. It also has a zero rate of change at the end of half-cycle, thereby ensuring a "soft" turn-on condition.

Furthermore, it is shown that the integral of the capacitor ($C_{ds}$) current over the half-cycle is zero and that the capacitance current has dropped to zero by the end of the half-cycle, both indicative of Class-E operation for the distributed load at 8.0 GHz. Similar simulated waveforms were obtained over the desired 2.0 GHz frequency band. Although not shown, the frequency response of the distributed load (FIG. 2b) should also be broadband having a nearly frequency independent response similar to its lumped version shown in FIG. 3(a).

In the illustrative application, the load circuit is synthesized for medium power PAs (~30 dBm, 1.0 W max). A single 0.25 um×720 um pHEMT device is used in this circuit. Such PAs are suitable as a single stage PA and/or as the first stage of a two stage Class-E High Power Amplifiers (HPAs).

Figure 4:
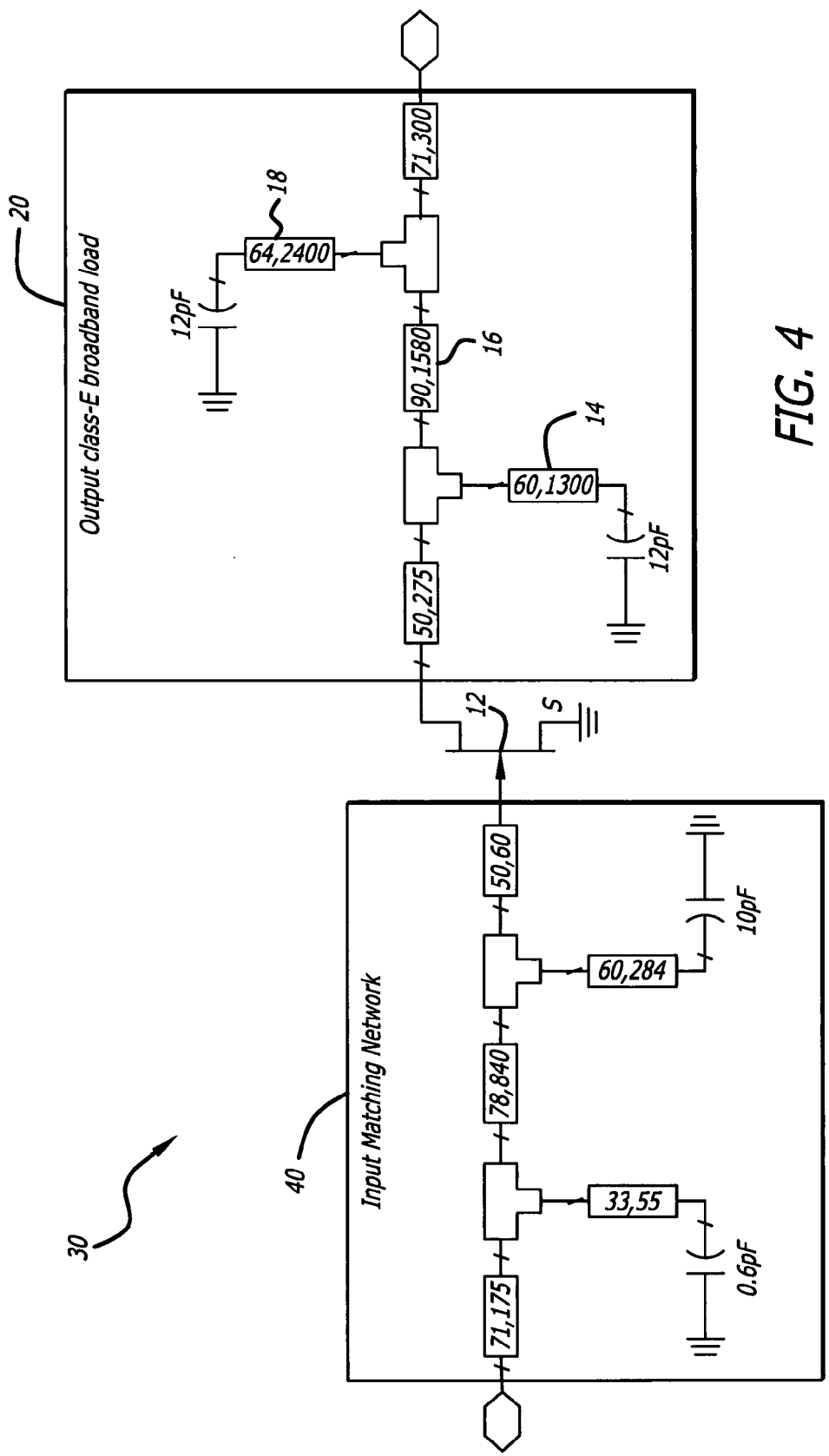
FIG. 4 shows a schematic circuit of a distributed representation of a monolithic Class-E amplifier with the broadband Class-E load in accordance with the present teachings.

FIG. 4 shows a schematic circuit of a distributed representation of a monolithic Class-E amplifier with the broadband Class-E load in accordance with the present teachings. The amplifier 30 of FIG. 4 includes an active device 12 with the inventive load 20. In the illustrative embodiment, the active device 12 is a Gallium-Arsenide pseudo-morphic, high-electron mobility transistor (GaAs pHEMT).

An input matching network 40 is provided at the input to the active device 12. The load 20 and input matching network 40 are designed with the width and length dimensions shown in microns for operation at 8-10 Ghz. Those of ordinary skill in the art may extend the present teachings to other frequencies without departing from the scope thereof.

For accurate and robust non-linear simulation of switching mode amplifiers, the device non-linear model should have the following properties:

Bias dependency of drain-to-source $C_{ds}(V_{ds}, V_{gs})$ and gate-to-drain $C_{gd}(V_{ds}, V_{gs})$ capacitances;

Bias dependency of input channel resistance $R_i(V_{ds}, V_{gs})$; and

Bias dependency of output channel resistance $R_{ds}(V_{ds}, V_{gs})$.

Also the device model should be able to accurately model the dispersion associated with the drain current, gm, and $R_{ds}$. If the pulsed DC IV technique is used for the model development, this requirement may be unnecessary. For this purpose, the EEHEMT model available in ICCAP (Agilent ICCAP, V.5.1) and ADS (Agilent Advanced Design Systems (ADS), V. 2003C).

A 0.3 μm×6×120 μm pHEMT device having a gate-drain breakdown voltage of greater than 18 V may be designed using currently available technology in accordance with the present teachings to meet performance goals for very large (>100,000 T/R elements) space based phased array radar requiring simultaneous broadband power (min. 200.0 mW) and PAE (min. 60%) over 8.0-10.0 GHz.

Figure 5:
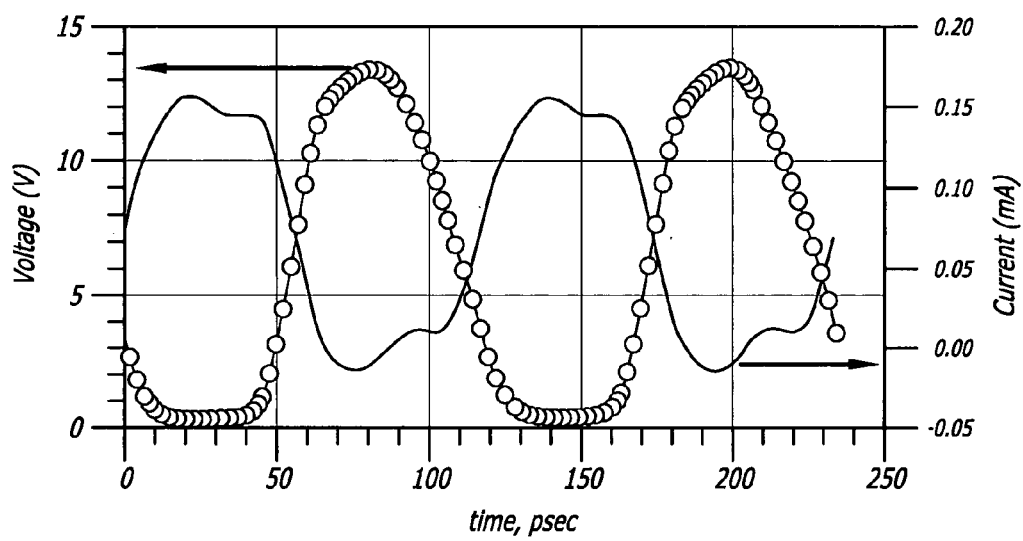
FIG. 5 depicts simulated voltage and current waveforms at the pHEMT output terminals of the amplifier of FIG 4.

FIG. 5 depicts simulated voltage and current waveforms at the pHEMT output terminals of the amplifier of FIG. 4. The waveforms show a switching mode behavior of the pHEMT device at 8.5 GHz. Similar waveforms may be provided over 8-10 GHz to confirm broadband operation.

Thus, the present invention has been described herein with reference to a particular embodiment for a particular application. Those having ordinary skill in the art and access to the present teachings will recognize additional modifications applications and embodiments within the scope thereof. For example, the present teachings are not limited to Class-E amplifiers. That is, the present teachings may be used in connection with any switching amplifier or circuit design.

It is therefore intended by the appended claims to cover any and all such applications, modifications and embodiments within the scope of the present invention.

Accordingly,

What is claimed is:

1. A method for designing a load for use with a Class-E amplifier including the steps of:

providing a lumped equivalent circuit representation of said load;

optimizing the lumped equivalent circuit representation of said load to achieve near ideal current and voltage operational characteristics over a predetermined frequency range using a time domain simulation;

transforming said optimized lumped equivalent circuit representation of said load to a distributed circuit representation; and optimizing the distributed circuit representation of said load to achieve near ideal current and voltage operational characteristics over a predetermined frequency range using a time domain simulation.

* * * * *